(12) United States Patent
Dai et al.

(10) Patent No.: US 9,329,495 B2
(45) Date of Patent: May 3, 2016

(54) OVERLAY METROLOGY SYSTEM AND METHOD

(71) Applicant: GLOBALFOUNDRIES Inc., Grand Cayman (KY)

(72) Inventors: Xintuo Dai, Clifton Park, NY (US); Binbin Yan, Eindhoven (NL)

(73) Assignee: GLOBALFOUNDRIES INC., Grand Cayman (KY)

( * ) Notice: Subject to any disclaimer, the term of this patent is extended or adjusted under 35 U.S.C. 154(b) by 80 days.

(21) Appl. No.: 14/084,676

(22) Filed: Nov. 20, 2013

(65) Prior Publication Data

US 2015/0138555 A1 May 21, 2015

(51) Int. Cl.
*G01B 11/00* (2006.01)
*G03F 7/20* (2006.01)

(52) U.S. Cl.
CPC .................................. *G03F 7/70633* (2013.01)

(58) Field of Classification Search
CPC ........... H01L 21/66; G06K 9/00; G01B 11/00
See application file for complete search history.

(56) References Cited

U.S. PATENT DOCUMENTS

2003/0021465 A1* 1/2003 Adel et al. ..................... 382/151
2007/0058169 A1* 3/2007 Ausschnitt et al. ............ 356/401

OTHER PUBLICATIONS

C.P. Ausschnitt et al., "Blossom Overlay Metrology Implementation", Proc. of SPIE vol. 6518 65180G-6, San Jose, CA, Feb. 25, 2007, 6 pages.
M. Adel, "Performance Study of New Segmented Overlay Marks for Advanced Wafer Processing", SPIE 5038-45, May 2003, 12 pages.

* cited by examiner

*Primary Examiner* — Tarifur Chowdhury
*Assistant Examiner* — Jamil Ahmed
(74) *Attorney, Agent, or Firm* — Heslin Rothenberg Farley & Mesiti P.C.

(57) ABSTRACT

Overlay metrology systems are provided which include, for instance: a first metrology pattern including at least two first pairs of sub-patterns, at least one sub-pattern lacking 90 degree rotational symmetry, and a first center position for the first metrology pattern being determinable in an X-Y coordinate layout from the at least two first pairs of sub-patterns; and a second metrology including at least two second pairs of sub-patterns, at least one sub-pattern lacking 90 degree rotational symmetry, and a second center position for the second metrology pattern being determinable in the X-Y coordinate layout from the at least two second pairs of sub-patterns. Methods of making overlay metrology systems are also provided, which include, for instance, providing a first metrology pattern and a second metrology pattern, and arranging the metrology patterns in relation to each other within the X-Y coordinate layout.

20 Claims, 7 Drawing Sheets

OVERLAY METROLOGY SYSTEM AND METHOD

FIELD OF THE INVENTION

The present invention generally relates to fabrication of integrated circuits, and more particularly, to a system and method for facilitating determining overlay accuracy between circuit structure fields of one or more layers of a circuit structure.

BACKGROUND

Conventional fabrication of integrated circuits generally requires the formation of multiple integrated circuit patterns, or fields, on one or more layers over a substrate wafer. These fields generally include numerous regions of micro-structures or nano-structures that are formed through photolithography, wet or dry etching processes, implantation or deposition processes, and the like. The relative positioning and alignment, or "overlay," between such fields is an important component of ensuring the functionality of the resultant integrated circuit, and as such minimizing overlay errors is a significant concern in the manufacturing of circuit structures such as integrated circuits. Typically, the overlay error tolerance level between any two fields is less than 40% of the minimum "critical dimension," or smallest feature size, of the fields, although some fields may demand even smaller overlay error tolerances.

Overlay metrology is one way to monitor overlay alignment and minimize overlay errors. This process generally forms overlay metrology target patterns, or simply "metrology patterns," in the same layer as the functional circuit structure fields that the metrology patterns correspond to. These metrology patterns are generally formed in an inactive region of the wafer or device being processed, usually at the edge, and are formed by the same tool or process that forms the functional structures of the circuit structure field. The metrology patterns may then be scanned and/or imaged by an overlay metrology tool, and the metrology patterns of any two fields or layers measured and compared to determine their relative positions, with deviations in the overlay of the target patterns generally corresponding to deviations in the overlay between the circuit structure fields. Many different types of overlay metrology patterns have been developed to address issues with older overlay metrology patterns, including improving the accuracy of overlay metrology measurements, reducing processing errors that may affect overlay metrology, reducing the amount of space on a wafer necessary to obtain measurements and comparisons between each pairing of circuit structure fields, and so on. Existing overlay metrology target patterns generally may address some of these issues but at the cost of failing to address or exacerbating other issues. There is thus a continuing need to develop new overlay metrology patterns that can effectively address these issues, and thereby facilitate circuit structure fabrication.

SUMMARY OF THE INVENTION

The shortcomings of the prior art are overcome and additional advantages are provided through the provision, in one aspect, of a system including: a first metrology pattern for a first circuit structure field, the first metrology pattern including at least two first pairs of sub-patterns, at least one sub-pattern of the at least two first pairs of sub-patterns lacking 90 degree rotational symmetry, and a first center position for the first metrology pattern being determinable in an X-Y coordinate layout. One first pair of sub-patterns of the at least two first pairs of sub-patterns independently determines an X coordinate of the first center position and another first pair of sub-patterns of the at least two first pairs of sub-patterns independently determines a Y coordinate of the first center position. The system further includes a second metrology pattern for a second circuit structure field, the second metrology pattern including at least two second pairs of sub-patterns, at least one sub-pattern of the at least two second pairs of sub-patterns lacking 90 degree rotational symmetry, and a second center position for the second metrology pattern being determinable in the X-Y coordinate layout. One second pair of sub-patterns of the at least two second pairs of sub-patterns independently determines an X coordinate of the second center position and another second pair of sub-patterns of the at least two second pairs of sub-patterns independently determines a Y coordinate of the second center position.

In another aspect a method for facilitating determining overlay accuracy is provided, including, for example: providing a first metrology pattern for a first circuit structure field, the first metrology pattern including at least two first pairs of sub-patterns, at least one sub-pattern of the at least two first pairs of sub-patterns lacking 90 degree rotational symmetry, and a first center position for the first metrology pattern being determinable in an X-Y coordinate layout. One first pair of sub-patterns of the at least two first pairs of sub-patterns independently determine an X coordinate of the first center position and another first pair of sub-patterns of the at least two first pairs of sub-patterns independently determine a Y coordinate of the first center position. The method further includes providing a second metrology pattern for a second circuit structure field, the second metrology pattern including at least two second pairs of sub-patterns, at least one sub-pattern of the at least two second pairs of sub-patterns lacking 90 degree rotational symmetry, and a second center position for the second metrology pattern being determinable in the X-Y coordinate layout. One second pair of sub-patterns of the at least two second pairs of sub-patterns independently determine an X coordinate of the second center position and another second pair of sub-patterns of the at least two second pairs of sub-patterns independently determine a Y coordinate of the second center position. The method further includes arranging the first metrology pattern and the second metrology pattern in relation to each other within the X-Y coordinate layout.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
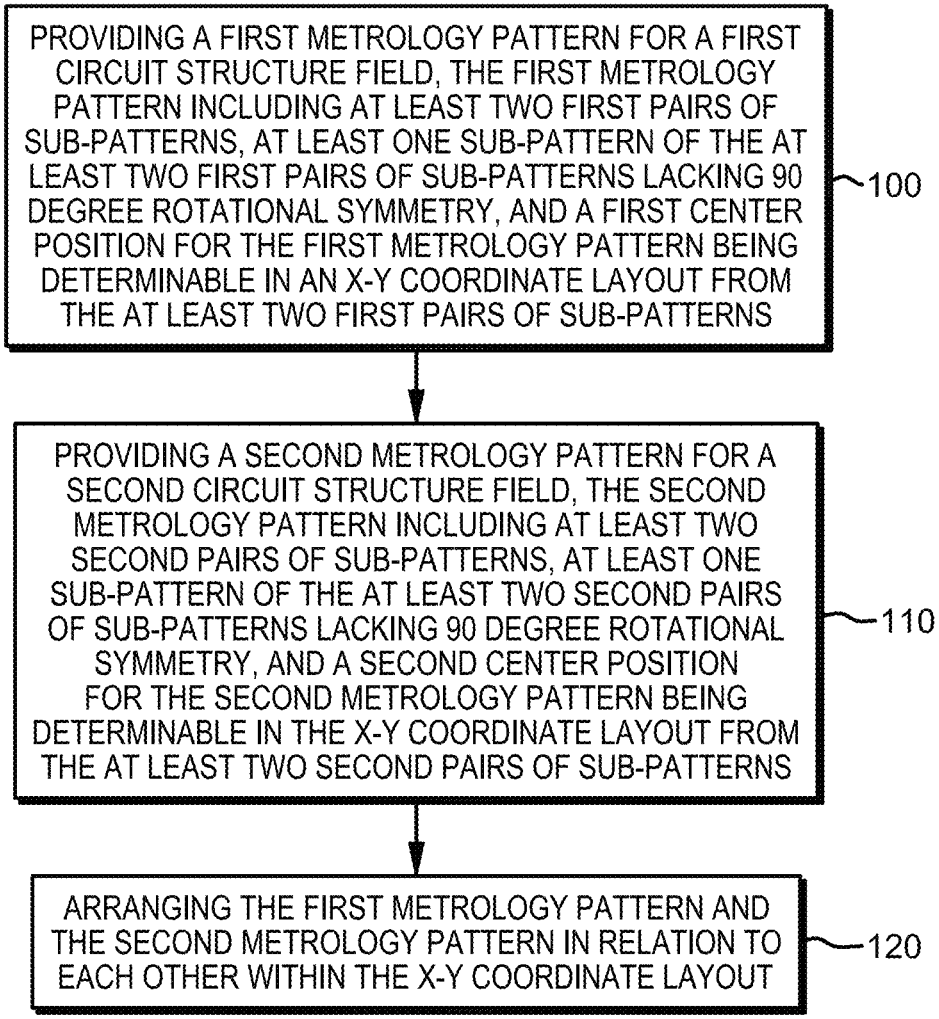
FIG. 1 depicts one embodiment of a process for facilitating determining overlay accuracy, including providing a first metrology pattern and a second metrology pattern, and arranging the metrology patterns within an X-Y coordinate layout, in accordance with one or more aspects of the invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

In one or more embodiments, the system of overlay metrology presented herein overcomes the shortcomings of previous overlay metrology systems. For instance, so-called "box-in-box" (BiB) or "box-in-frame" patterns have been commonly used in overlay metrology. BiB metrology, however, is subject to numerous problems, among them: each pair of circuit structure fields requires a separate pair of boxes to be printed, and these pairs of box patterns cannot be nested together or placed in a compact space; each pair of boxes requires a certain margin of space around it to separate that pair from the next pair of boxes; the side bars of each box are subject to "process variation," or errors in placement of the bars due to the printing process itself rather than overlay error, thus introducing an additional measurement error that may be difficult to account for; and BiB is not well-suited for separating horizontal deviations from vertical deviations, which are frequently critical for certain layer-to-layer and field-to-field contacts.

The so-called advanced imaging metrology (AIM) marks, and the numerous variants of the AIM marks, improved on BiB metrology patterns in some respects. AIM marks are less subject to process variation errors, allowing for more accurate overlay metrology, and because a full AIM mark has a pair of sub-patterns oriented horizontally and another pair oriented vertically, a full AIM mark can provide overlay error information in both vertical and horizontal dimensions. However, AIM marks require a great deal of wafer space because a full AIM mark must be printed for each pairing of fields in the integrated circuits, usually along with field-identifying marks alongside the actual AIM mark, and this generally means that the metrology tool used to image the marks cannot view more than a few marks in a single image.

The so-called blossom targets, and variants of the blossom targets, were also improvements over BiB patterns. Blossom targets arrange metrology patterns for each circuit structure field in a nested pattern centered on a common center-point; because the marks are nested, each field's metrology pattern can be measured at the same time against each other field's metrology pattern within the same image. Blossom targets are thus a compact means for printing metrology patterns in a small space on a wafer, and allow for multiple field-to-field measurements within a single image taken by the metrology tool. However, blossom targets have been found to be subject to similar process variation problems that BiB suffers from, and the targets are not well suited for separating out horizontal versus vertical overlay errors. In the past, these different systems of metrology patterns have been viewed as incompatible with each other for various reasons. The present system of overlay metrology overcomes the shortcomings of prior systems, providing an overlay metrology system that provides robust and accurate measurement with separable horizontal and vertical measures while reducing the amount of space on a wafer needed to print the metrology patterns themselves.

Thus, provided herein, in one aspect, is a system of overlay metrology. The system includes, for instance: a first metrology pattern for a first circuit structure field, the first metrology pattern including at least two first pairs of sub-patterns, with at least one sub-pattern of the at least two first pairs of sub-patterns lacking 90 degree rotational symmetry, and a first center position for the first metrology pattern being determinable in an X-Y coordinate layout from the two first pairs of sub-patterns; and a second metrology pattern for a second circuit structure field, the second metrology pattern including at least two second pairs of sub-patterns, with at least one sub-pattern of the at least two second pairs of sub-patterns lacking 90 degree rotational symmetry, and a second center position for the second metrology pattern being determinable in the X-Y coordinate layout from the two second pairs of sub-patterns. In one or more embodiments, the X-Y coordinate layout facilitates an arrangement of the first metrology pattern in relation to the second metrology pattern, and this arrangement facilitates comparison of the first center position of the first metrology pattern with the second center position of the second metrology pattern.

In one embodiment, the X-Y coordinate layout arranges metrology patterns in a "nested" arrangement wherein the center positions of both a first metrology pattern and a second metrology pattern are designed to coincide at the same pre-defined point in the X-Y coordinate layout, so that any measured deviations between the first center position and the second center position indicate the amount of overlay error between the first circuit structure and the second circuit structure. In one or more such implementations, one or more additional metrology patterns may also be included in the nested arrangement so that the center positions of the additional patterns also are designed to coincide at the same pre-defined point in the X-Y coordinate layout as for the first and second center positions, thus permitting each metrology pattern to be measured and compared against each other metrology pattern and thus determine overlay errors between the corresponding circuit structures. In one example, the metrology patterns may be squares, in which a square is defined by two pairs of sub-patterns arranged so that the centers of each individual sub-pattern are located at the corners of the square pattern. The sub-patterns of any one or more metrology patterns, in one example, may include a periodic structure, in which the periodic structure has multiple structural elements. The structural elements of a periodic structure may, for instance, be a plurality of parallel bars interleaved with spaces separating the bars. Individual structural elements of a periodic structure may themselves include a periodic sub-structure, the sub-structure having multiple structural sub-elements.

In an alternative embodiment, the X-Y coordinate layout arranges metrology patterns in an "offset" arrangement, wherein a first metrology pattern and a second metrology pattern each have a center position designed to be offset by pre-defined horizontal and vertical amounts, as measured in the X-Y coordinate layout, so that any measured deviations from these pre-defined offset amounts indicate the amount of overlay error between the first circuit structure and the second circuit structure. In one or more such implementations, one or more additional metrology patterns may also be included in the offset arrangement so that the center position of any one additional pattern is also designed be offset by pre-defined horizontal and vertical amounts (as measured in the X-Y coordinate layout) relative to each of the first and second center positions (as well as any other additional metrology patterns included in the arrangement), thus permitting each metrology pattern to be measured and compared against each other metrology pattern and thus determine overlay errors between the corresponding circuit structures. In one or more examples of this arrangement, the metrology patterns do not nest with each other. In one example, the metrology patterns may be squares, in which a square is defined by two pairs of sub-patterns arranged so that the sub-patterns of each of the two pairs occupy diagonally opposed quadrants of the square pattern. The sub-patterns of any one or more metrology patterns, in one example, may include a periodic structure, in which the periodic structure has multiple structural elements. The structural elements of a periodic structure may, for instance, be a plurality of parallel bars interleaved with spaces separating the bars. Individual structural elements of a periodic structure may themselves include a periodic sub-structure, the sub-structure having multiple structural sub-elements.

Also provided herein, in another aspect, is a method for facilitating determining overlay accuracy. The method includes, for instance: providing a first metrology pattern for a first circuit structure field, the first metrology pattern including at least two first pairs of sub-patterns, at least one sub-pattern of the at least two first pairs of sub-patterns lacking 90 degree rotational symmetry, and a first center position for the first metrology pattern being determinable in an X-Y coordinate layout from the at least two first pairs of sub-patterns; providing a second metrology pattern for a second circuit structure field, the second metrology pattern including at least two second pairs of sub-patterns, at least one sub-pattern of the at least two second pairs of sub-patterns lacking 90 degree rotational symmetry, and a second center position for the second metrology pattern being determinable in the X-Y coordinate layout from the at least two second pairs of sub-patterns; and arranging the first metrology pattern and the second metrology pattern in relation to each other within the X-Y coordinate layout. In one embodiment, arranging the metrology patterns includes nesting the first metrology pattern with the second metrology pattern so that the first center position and the second center position are designed to coincide at a same point in the X-Y coordinate layout. In another embodiment, arranging the metrology patterns includes offsetting the first metrology pattern from the second metrology pattern, so that the first center position and second center position are designed to be offset horizontally by a pre-defined amount $X_1$ in the X-Y coordinate layout and offset vertically by a pre-defined amount $Y_1$ in the X-Y coordinate layout, and wherein the first metrology pattern and the second metrology pattern are not designed to be nested Reference is made below to the drawings, which are not drawn to scale for ease of understanding, wherein the same reference numbers used throughout different figures designate the same or similar components.

By way of summary, FIG. 1 illustrates one embodiment of a method of facilitating determining overlay accuracy, in accordance with one or more aspects of the present invention. In the embodiment illustrated, the method includes, for example: providing a first metrology pattern for a first circuit structure field, the first metrology pattern including at least two first pairs of sub-patterns, at least one sub-pattern of the at least two first pairs of sub-patterns lacking ninety degree rotational symmetry, and a first center position for the first metrology pattern being determinable in an X-Y coordinate layout from the at least two first pairs of sub-patterns 100; providing a second metrology pattern for a second circuit structure field, the second metrology pattern including at least two second pairs of sub-patterns, at least one sub-pattern of the at least two second pairs of sub-patterns lacking ninety degree rotational symmetry, and a second center position for the second metrology pattern being determinable in the X-Y coordinate layout from the at least two second pairs of sub-patterns 110; and arranging the first metrology pattern and the second metrology pattern in relation to each other within the X-Y coordinate layout 120. In one example, arranging the first metrology pattern and the second metrology pattern may include nesting the first metrology with the second metrology pattern, so that the first center position and the second center position are designed to coincide at a same point in the X-Y coordinate layout, if there is no overlay error between the first circuit structure field and the second circuit structure field. In another example, arranging the first metrology pattern and the second metrology pattern may include offsetting the first metrology pattern from the second metrology pattern, so that the first center position and second center position are designed to be separated horizontally by an amount $X_1$ and separated vertically by an amount $Y_1$, if there is no overlay error between the first circuit structure field and the second circuit structure field.

Figure 2A:
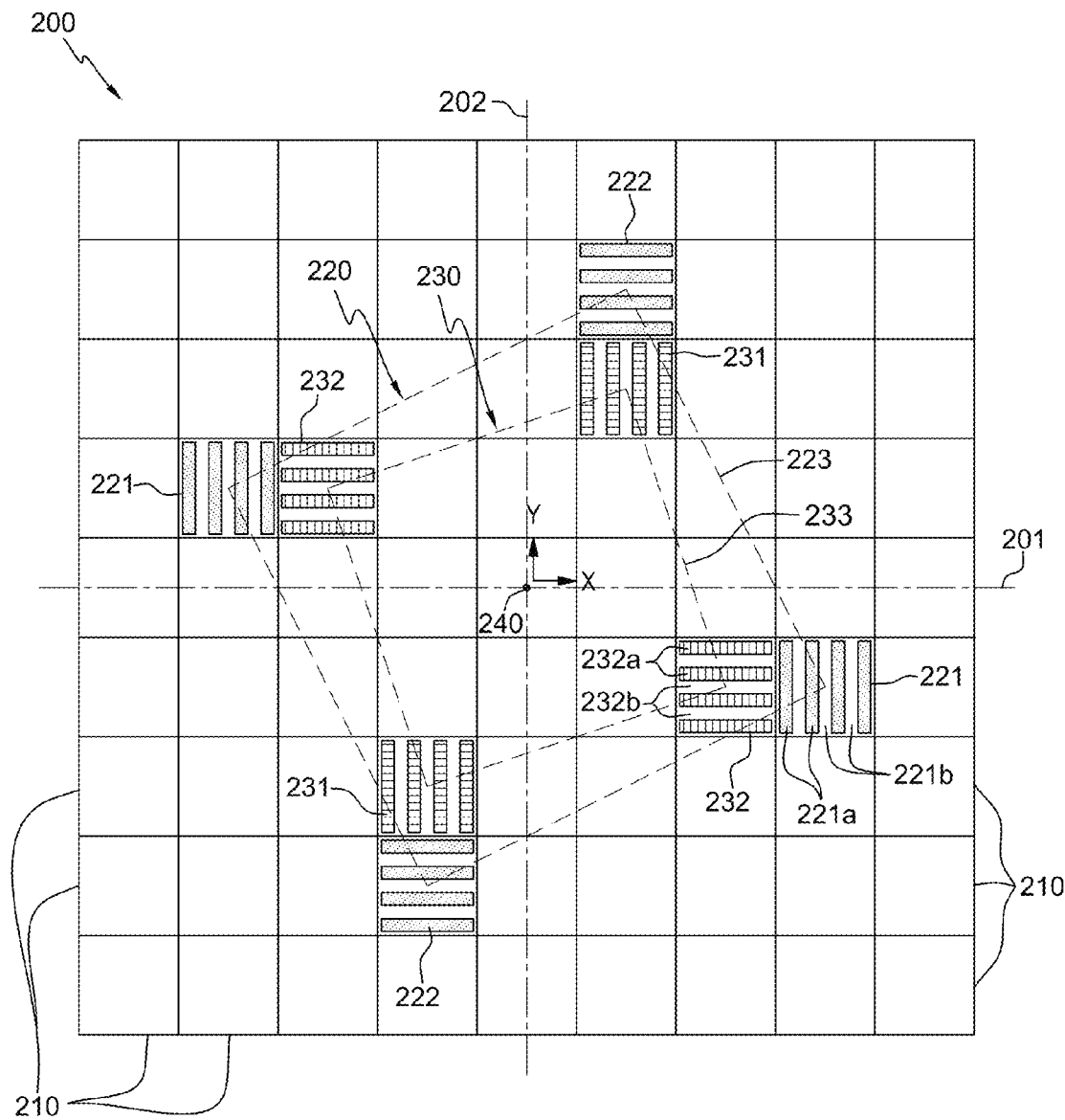
FIG. 2A depicts an embodiment of an overlay metrology system with two example metrology patterns in a nested arrangement within an X-Y coordinate layout, in accordance with one or more aspects of the invention.
Figure 2B:
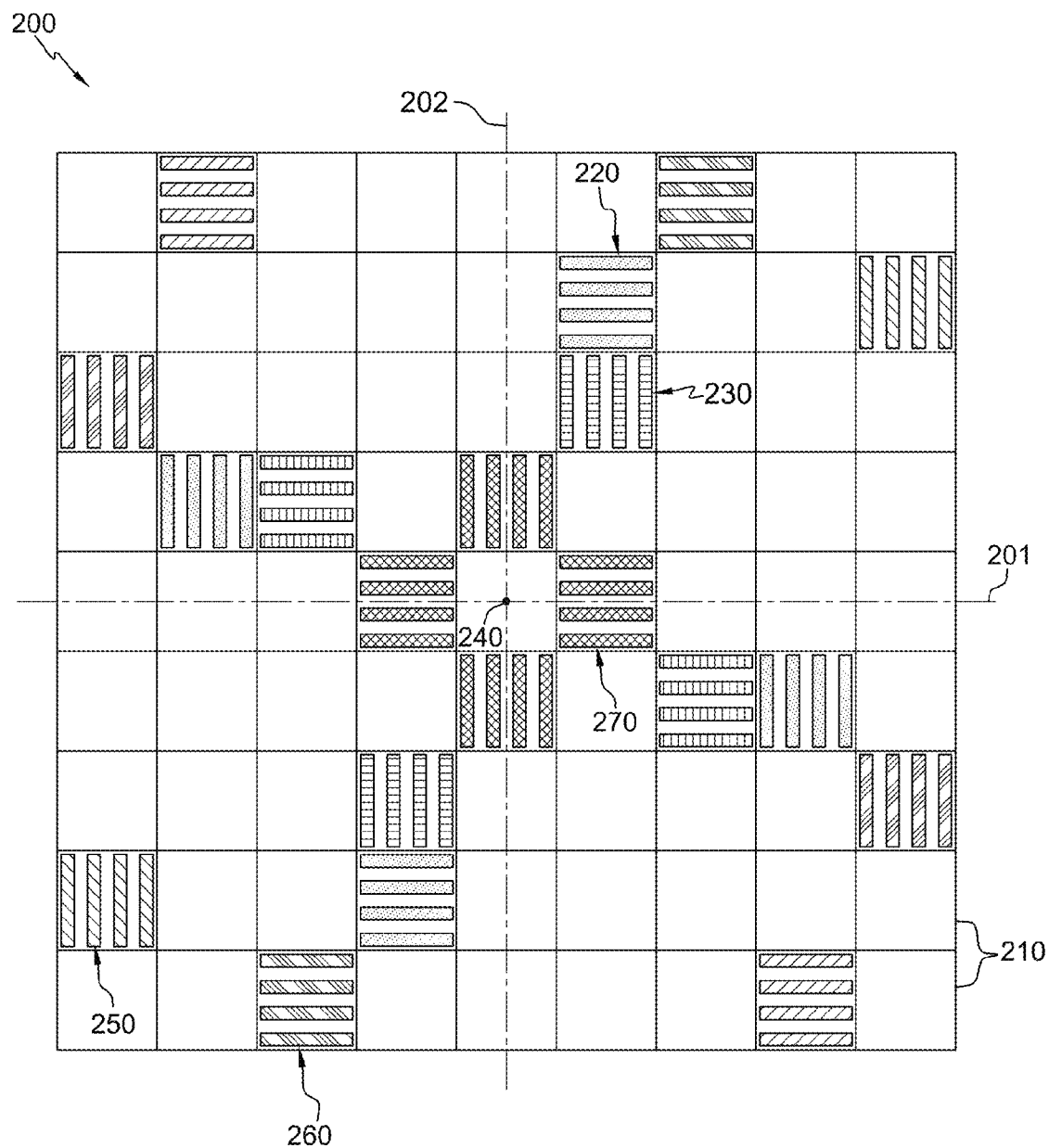
FIG. 2B depicts another embodiment of an overlay metrology system similar to FIG. 2A, with several example metrology patterns nested in an arrangement within the X-Y coordinate layout, in accordance with one or more aspects of the invention.
Figure 2C:
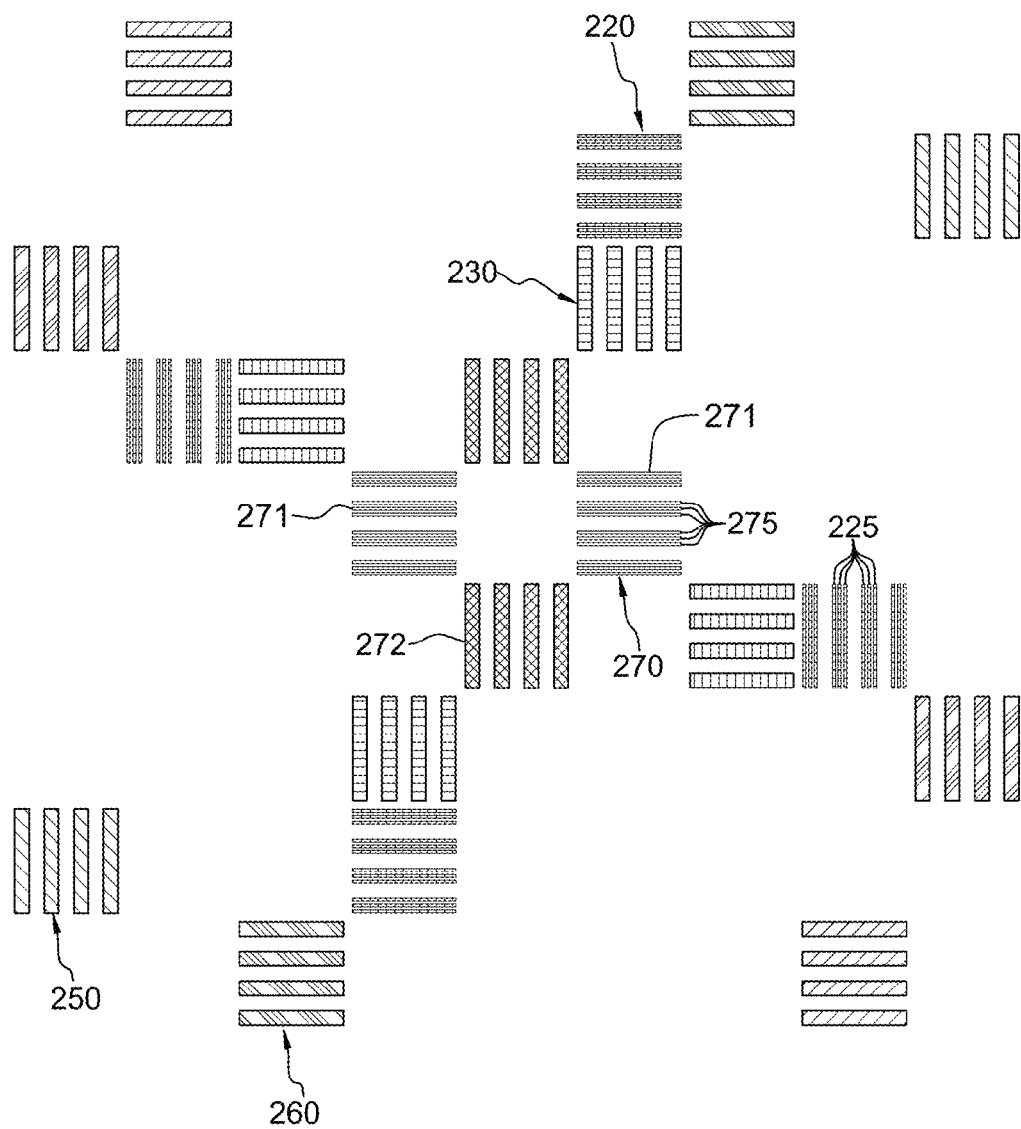
FIG. 2C depicts the several example metrology patterns of FIG. 2B in the nested arrangement, and shown without the X-Y coordinate layout as the metrology patterns may appear in practice, in accordance with one or more aspects of the invention.

FIGS. 2A-2C depict, by way of example, several components of one embodiment of a system of overlay metrology, in accordance with one or more aspects of the present invention. These figures illustrate an example of an X-Y coordinate layout that facilitates arrangement of multiple metrology patterns in a nested arrangement, as well as illustrate how metrology patterns may appear (in an image produced by a metrology tool, for example) in actual practice.

FIG. 2A depicts one exemplary X-Y coordinate layout 200, with a horizontal X axis 201 and vertical Y axis 202, and with pattern blocks 210 arranged symmetrically about the intersection of X axis 201 and Y axis 202. These pattern blocks 210, as well as the axes 201, 202 of the coordinate layout, are to be understood as guides for a designed placement of metrology patterns and their component sub-patterns relative to one another, and may not actually be printed components of the system of overlay metrology. By way of example, pattern blocks 210 depicted in FIG. 2A form a 9×9 grid of pattern blocks in which metrology patterns and their component sub-patterns may be placed. However, it should be understood that any N×N grid of pattern blocks may be applicable, according to the specific needs of a particular manufacturing process.

FIG. 2A also depicts an exemplary first metrology pattern 220 and an exemplary second metrology pattern 230 arranged in a nested fashion by or within the X-Y coordinate layout 200. First metrology pattern 220 and second metrology pattern 230 are designed to have their center positions coincide at the same point 240 if, ideally, there is no overlay error between the corresponding first circuit structure field and second circuit structure field. The designated center point 240 for metrology patterns 220 and 230 is here depicted as being the intersection of the X and Y axes of the X-Y coordinate layout, although a different center point in the X-Y coordinate system may be designated. The intersection of the axes is provided by way of example only, but is an ideal point as measuring the positions of the center points of each metrology system may be simplest when measured relative to this point. Patterns 220 and 230 may correspond to circuit structure fields on different layers of a circuit structure, or to two separate circuit structure fields formed on the same layer of a circuit structure.

By way of example, pattern 220 includes two pairs of sub-patterns, one vertically oriented pair of sub-patterns 221 and one horizontally oriented pair of sub-patterns 222, and each individual sub-pattern is arranged according to pattern blocks 210 so as to form a first square metrology pattern with the centers of the sub-patterns coinciding with the corners of a square 223. Pattern blocks 210 depict the ideal designed placement of each sub-pattern; in practice, sub-patterns may deviate from the designed placement locations, and pattern blocks 210 may not actually be printed. Similarly by way of example, pattern 230 includes one vertically oriented pair 231 of sub-patterns and one horizontally oriented pair 232 of sub-patterns, also arranged according to pattern blocks 210 so as to form a second square metrology pattern, depicted by square 233. The square metrology patterns depicted by squares 223 and 233 need not be aligned or oriented with each other, aside from the designed coincidence of the centers of each metrology pattern, and need not be aligned with either the X axis or Y axis. Squares 223 and 233 are provided in this figure for ease of visual reference and understanding only, and may not be part of the metrology pattern actually printed on a wafer or other device. Similarly, sub-patterns 221 and 222, as well as sub-patterns 231 and 232, are depicted here with differing patterns for ease of visual reference to clearly show sub-patterns belonging to the same metrology pattern, and may not be part of the metrology pattern actually printed. Although square metrology pattern arrangements of sub-patterns may be simple or ideal arrangements, other non-square metrology pattern arrangements may alternatively be used, such as a circle.

The individual sub-patterns of metrology patterns 220 and 230, and any other desired metrology pattern based on the disclosure provided herein, may be any sub-pattern that is not invariant to rotation by ninety degrees about the center of the sub-pattern, as illustrated by sub-patterns 221, 222, 231, and 232. This lack of invariance to ninety degree rotation permits, for instance, measurement of a sub-pattern's horizontal position, if the sub-pattern is oriented vertically (as depicted by sub-patterns 221 and sub-patterns 231), or of a sub-pattern's vertical position, if the sub-pattern is oriented horizontally (as depicted by sub-patterns 222 and sub-patterns 232). The vertically oriented pair of sub-patterns 221 thus provides, in one embodiment, a measure of the horizontal position of the center of pattern 220, and the horizontally oriented pair of sub-patterns 222 provides (in one embodiment) a measure of the vertical position of the center of pattern 220. Similarly, sub-pattern pair 231 provides, in one embodiment, a horizontal position of the center of pattern 230, and sub-pattern pair 232 provides (in one embodiment) a vertical position of the center of pattern 230. These measures of the center positions of patterns 220 and 230 may then be compared, as well as the individual horizontal and vertical components of those positions, to determine the overlay error between the patterns, and thus the overlay error between the corresponding circuit structure fields. Measurement of sub-pattern positions and/or positions of the centers of each metrology pattern may be accomplished by the use of an overlay metrology tool. An overlay metrology tool generally is a system combining hardware capable of optically scanning metrology patterns of a processed wafer with software capable of processing the information obtained from scanning metrology patterns. The hardware may make use of image-based or scatterometry-based technologies, and should be capable of resolving the individual elements of each sub-pattern. The software should ideally be configured to properly recognize the types of sub-patterns that have been printed, as well as properly determine which sub-patterns belong to each metrology pattern. By way of example only, an Archer™ Series overlay metrology system (by KLA-Tencor Corporation) may provide appropriate hardware and software for use with one or more embodiments of a metrology system described herein. As another example, a TwinScan™ series system (by ASML Corporation) may also provide appropriate hardware and software for use with one or more embodiments of a metrology system described herein.

In the exemplary embodiment depicted, each sub-pattern includes a periodic structure oriented either horizontally (parallel with the X-axis) or vertically (parallel with the Y-axis). Alternatively, the sub-patterns may include a non-periodic structure lacking ninety degree rotational symmetry. A periodic structure generally includes multiple structural elements. These may be, by way of example, a series of parallel bars 221a, 232a interleaved with spaces 221b, 232b that separate the bars. To obtain multiple measurement signals from each sub-pattern, and thus minimize errors introduced by processing variations, multiple structural elements may be formed or printed for each periodic structure. The outermost structural element of a periodic structure generally tends to be the element most susceptible to process variations, and the inner structural elements tend to be "protected" from process variations by the outermost element, allowing (in one embodiment) for the outermost element to essentially be ignored while making use of the other structural elements for accurate measurement. By way of example only, periodic structures 221, 222, 231 and 232 are depicted here as having four parallel bars with interleaved spaces between the bars. More or fewer bars may alternatively be used in such sub-patterns, and the number of structural elements for the sub-patterns of one metrology pattern may differ from the number of structural elements of another metrology pattern. By way of example, other types of periodic structures with alternative structural elements may possibly be used, other than the bars interleaved with spaces as depicted in this example. By way of example only, the structural elements may be bars with a different pitch, a series of bars, or may be other linear or non-linear shapes.

FIG. 2B depicts the X-Y coordinate layout 200 and metrology patterns 220 and 230 of the example of FIG. 2A, along with additional metrology patterns 250, 260, and 270, arranged in a nested pattern within the X-Y coordinate layout 200 to illustrate a further example of how multiple metrology patterns for multiple circuit structures may be nested in a single metrology system. Five patterns are depicted here for visual simplicity; in practice there may be many more patterns or even fewer patterns, depending on the manufacturing process or the particular stage of processing, and the patterns may be arranged in different locations within the X-Y coordinate layout arrangement, according to the needs of the particular manufacturing process. As in FIG. 2A, each of the metrology patterns depicted in FIG. 2B has a center designed to coincide at 240 with the center of each other metrology pattern if no overlay errors between any circuit structure fields exist. By way of example only, each of the metrology patterns 250, 260, and 270, similar to patterns 220 and 230, is a square metrology pattern in which the centers of the sub-patterns of each metrology pattern coincide with the corner of the square pattern (the square patterns not depicted in this figure for ease of visual reference). Measurement of the position of the center of each metrology pattern 250, 260, and 270 may be accomplished as described above for patterns 220 and 230. As in FIG. 2A, related sub-patterns of each metrology pattern are depicted here with differing patterns for ease of visual reference to clearly show which sub-patterns belong to the same metrology pattern, and may not be part of the metrology pattern actually printed.

FIG. 2C depicts an example embodiment of a system of overlay metrology without the X-Y coordinate layout depicted, to illustrate an example of how multiple metrology patterns (similar to those of FIG. 2B) may appear in actual practice, for example, as printed on an inactive space of a manufactured wafer. FIG. 2C also depicts some sub-patterns of two metrology patterns (220 and 270) as including periodic structures with structural elements that themselves contain sub-structures 225, 275 including a plurality of sub-elements. Such sub-structures may be used for circuit structure fields with finely-sized circuit regions, oriented with a particular direction with respect to other fields, which are much smaller than the size of other regions of the circuit structure field. The sub-elements of the sub-structures 225, 275 allow for finer measurement of the overlay of these finely-size circuit regions. By way of example, metrology pattern 270 is depicted as having one pair of sub-patterns 271 that includes sub-structures 275 with a plurality of sub-elements, and another pair of sub-patterns 272 lacking such sub-structures. This may correspond, for example, to a circuit structure field with finely-sized regions oriented in one direction for which a finer measurement of overlay is required. By way of example, metrology pattern 220 illustrates a metrology pattern in which all sub-patterns make use of sub-structures 225. By way of further example, metrology patterns 230, 250, and 260 are depicted in conjunction with patterns 270 and 220 to illustrate that, within the same system of overlay metrology, metrology patterns with sub-patterns having sub-structures may be combined with metrology patterns with sub-patterns that do not have sub-structures. As in FIG. 2A, related sub-patterns of each metrology pattern are depicted here with differing patterns for ease of visual reference to clearly show which sub-patterns belong to the same metrology pattern, and may not be part of the metrology pattern actually printed.

Figure 3A:
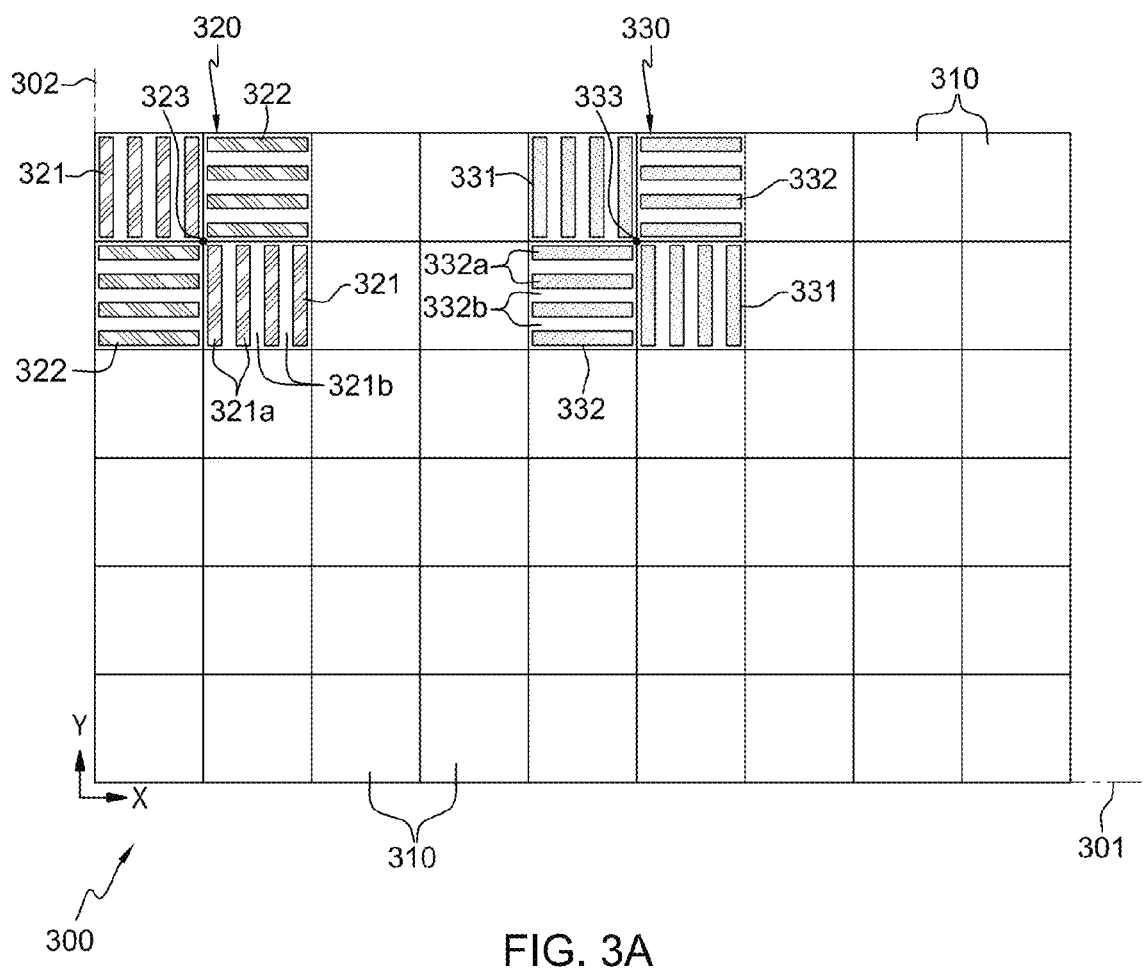
FIG. 3A depicts an alternative embodiment of an overlay metrology system with two example metrology patterns in an offset arrangement within an X-Y coordinate layout, in which the metrology patterns are not nested and with centers designed to be separated by pre-defined amounts, in accordance with one or more aspects of the invention.
Figure 3B:
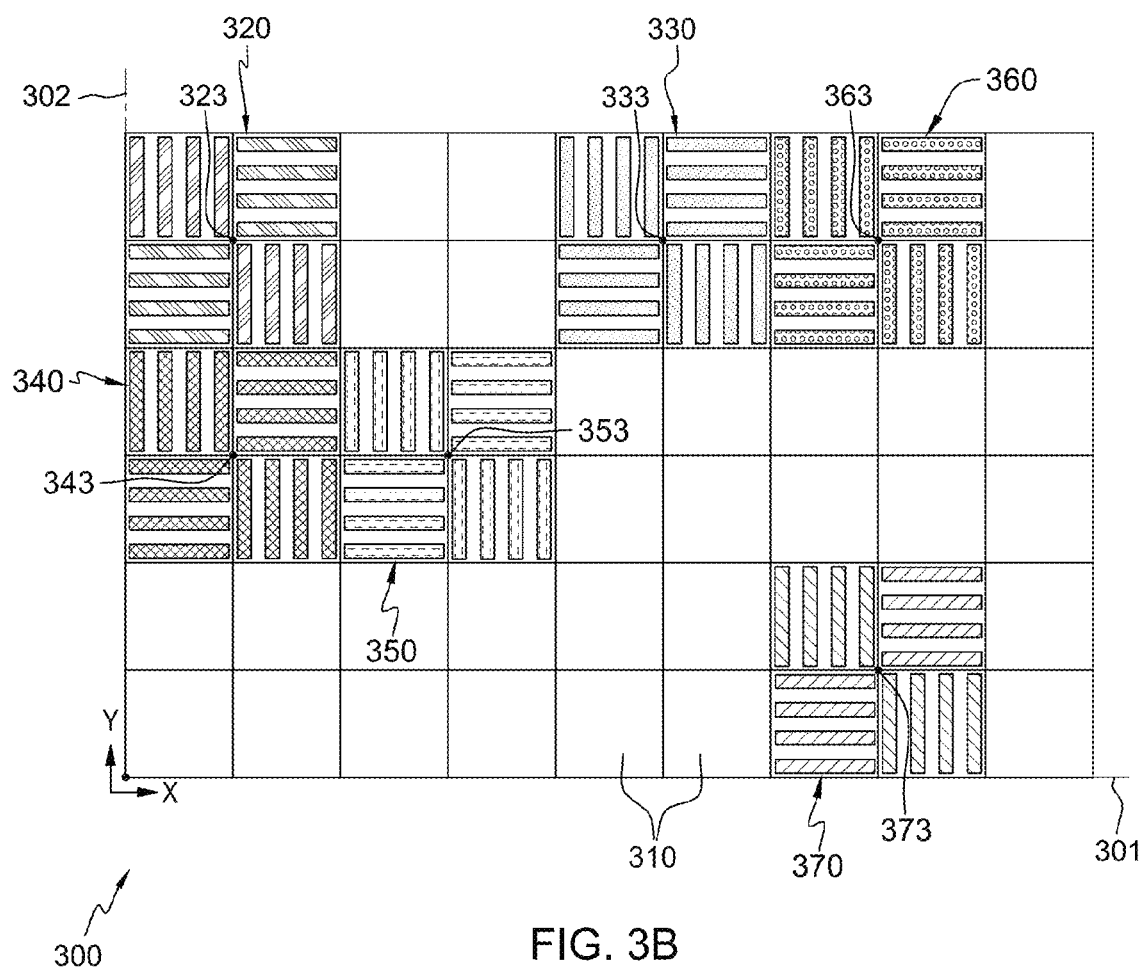
FIG. 3B depicts another embodiment of an overlay metrology system similar to FIG. 3A, with several example metrology patterns arranged according to the coordinate layout, in which the metrology patterns are not nested and with centers designed to be separated by pre-defined amounts, in accordance with one or more aspects of the invention.
Figure 3C:
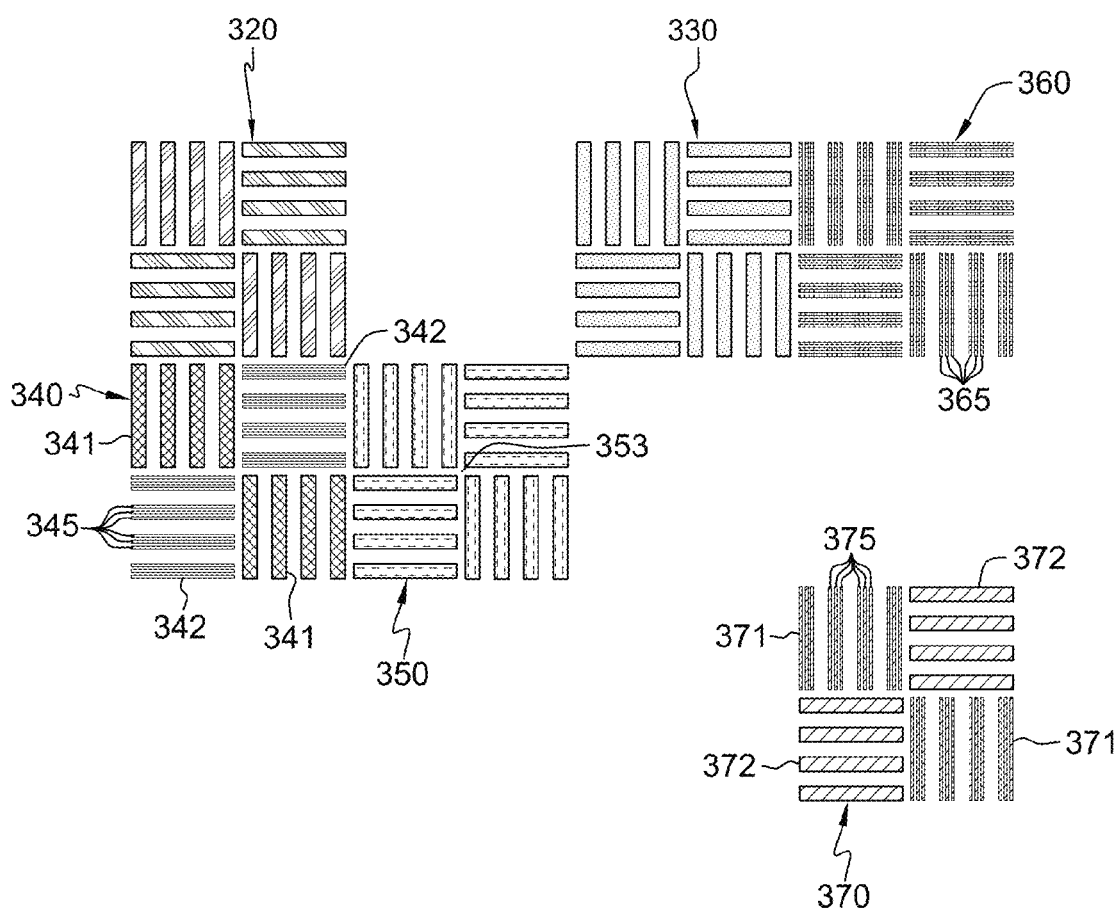
FIG. 3C depicts the several example metrology patterns of FIG. 3B, and shown without the X-Y coordinate layout as the metrology patterns may appear in practice, in accordance with one or more aspects of the invention.

FIGS. 3A-3C depict, by way of example, several components of an alternative embodiment of a system of overlay metrology, in accordance with one or more aspects of the present invention. These figures illustrate an example of an X-Y coordinate layout that facilitates an offset arrangement of multiple metrology patterns, as well as illustrate how metrology patterns may appear (in an image produced by a metrology tool, for example) in actual practice.

FIG. 3A depicts an exemplary X-Y coordinate layout 300, with a horizontal X axis 301 and vertical Y axis 302, and with pattern blocks 310 arranged in a single quadrant of X-Y coordinate layout 300. Pattern blocks 310, as well as the axes 301, 302 of the coordinate layout are to be understood as guides for an ideal, designed placement of metrology patterns and their component sub-patterns relative to one another, and may not be actual printed components of the system of overlay metrology. By way of example, the pattern blocks 310 depicted in FIG. 3A form a 10×6 grid of blocks in which metrology blocks may be placed. However, it should be understood that any M×N grid of pattern blocks may be applicable, where M and N may be the same or different, according to the specific needs of a particular manufacturing process. FIG. 3A further depicts, by way of example only, the grid of pattern blocks 310 placed within a quadrant of the X-Y coordinate layout in which the horizontal (X) and vertical (Y) positions of each pattern block are positive. A different placement of the grid of pattern blocks 310 may alternatively be used.

FIG. 3A also depicts an exemplary first metrology pattern 320 and an exemplary second metrology pattern 330 arranged in an offset arrangement within the X-Y coordinate layout 300. First metrology pattern 220 has a first center point 323 and second metrology pattern 330 has a second center point 333. These center points are designed to have positions that are separated or offset by pre-defined amounts $X_1$ and $Y_1$ when, ideally, there is no overlay error between the corresponding first circuit structure field and second circuit structure field. Patterns 320 and 330 may correspond to circuit structure fields on different layers of a circuit structure, or to two separate circuit structure fields formed on the same layer of a circuit structure.

By way of example, pattern 320 includes two pairs of sub-patterns, one vertically oriented pair of sub-patterns 321 and one horizontally oriented pair of sub-patterns 322, and each individual sub-pattern is arranged according to pattern blocks 310 so as to form a first square metrology pattern with each sub-pattern occupying one quadrant of the first square metrology pattern. Similarly, by way of example, pattern 330 includes one vertically oriented pair 331 of sub-patterns and one horizontally oriented pair 332 of sub-patterns, also arranged according to pattern blocks 310 so as to form a second square metrology pattern, again with each sub-pattern occupying one quadrant of the second square metrology pattern. Pattern blocks 310 depict the ideal designed placement of each sub-pattern; in practice, sub-patterns may deviate from the designed placement locations, and pattern blocks 310 may not actually be printed. Similarly, sub-patterns 321 and 322, as well as sub-patterns 331 and 332, are depicted here with differing patterns for ease of visual reference to clearly show sub-patterns belonging to the same metrology pattern, and may not be part of the metrology pattern actually printed. Although square metrology pattern arrangements of sub-patterns are a simple arrangement and may also be an ideal arrangement, other non-square metrology pattern arrangements may alternatively be used.

The individual sub-patterns of metrology patterns 320 and 330, and any other desired metrology pattern based on the disclosure provided herein, may be any sub-pattern that is not invariant to rotation by ninety degrees about the center of the sub-pattern, as illustrated by sub-patterns 321, 322, 331, and 332. This lack of invariance to ninety degree rotation permits, for instance, measurement of a sub-pattern's horizontal position, if the sub-pattern is oriented vertically (as depicted by sub-patterns 321 and sub-patterns 331), or of a sub-pattern's vertical position, if the sub-pattern is oriented horizontally (as depicted by sub-patterns 322 and sub-patterns 332). The vertically oriented pair of sub-patterns 321 thus provides, in one embodiment, a measure of the horizontal position of the center of pattern 320, and the horizontally oriented pair of sub-patterns 322 provides (in one embodiment) a measure of the vertical position of the center of pattern 320. Similarly, sub-pattern pair 331 provides, in one embodiment, a horizontal position of the center of pattern 330, and sub-pattern pair 332 provides (in one embodiment) a vertical position of the center of pattern 330. These measures of the center positions of patterns 320 and 330 may then be compared, as well as the individual horizontal and vertical components of those positions, to determine the overlay error between the patterns, and thus the overlay error between the corresponding circuit structure fields. In the exemplary embodiment depicted, each sub-pattern includes a periodic structure oriented either horizontally (parallel with the X-axis) or vertically (parallel with the Y-axis). Alternatively, the sub-patterns may include a non-periodic structure lacking ninety degree rotational symmetry. A periodic structure generally includes multiple structural elements. These may be, by way of example, a series of parallel bars 321a, 332a interleaved with spaces 321b, 332b that separate the bars. To obtain multiple measurement signals from each sub-pattern, and thus minimize errors introduced by processing variations, multiple structural elements may be formed or printed for each periodic structure. The outermost structural element of a periodic structure generally tends to be the element most susceptible to process variations, and the inner structural elements tend to be "protected" from process variations by the outermost element, allowing (in one embodiment) for the outermost element to essentially be ignored while making use of the other structural elements for accurate measurement. By way of example only, periodic structures 321, 322, 331 and 332 are depicted here as having four parallel bars with interleaved spaces between the bars. More or fewer bars may alternatively be used in such sub-patterns, and the number of structural elements for the sub-patterns of one metrology pattern may differ from the number of structural elements of another metrology pattern.

FIG. 3B depicts the X-Y coordinate layout 300 and metrology patterns 320 and 330 of the example of FIG. 2A, along with additional metrology patterns 340, 250, 360, and 370, in an offset arrangement within X-Y coordinate layout 300 to illustrate a further example of how multiple metrology patterns for multiple circuit structures may be arranged in the example metrology system. Six patterns are depicted here for visual simplicity; in practice there may be many more patterns or even fewer patterns, depending on the manufacturing process or the particular stage of processing, and the patterns may be arranged in different locations within the X-Y coordinate layout arrangement, according to the needs of the particular manufacturing process. As in FIG. 3A, related sub-patterns of each metrology pattern are depicted here with differing patterns for ease of visual reference to clearly show which sub-patterns belong to the same metrology pattern, and may not be part of the metrology pattern actually printed. The centers of additional metrology patterns 340, 350, 360 and 370 are denoted respectively by 343, 353, 363, and 373. The position of the center of any one metrology pattern is designed to be a pre-defined horizontal distance and a pre-defined vertical distance from another metrology pattern. For example, as in FIG. 2A, the center 323 of metrology pattern 320 is designed to be separated from the center 333 of metrology pattern 330 by pre-defined amounts $X_1$ and $Y_1$. As well, the center 323 of metrology pattern 320 is designed to be separated from, for example, the center 343 of metrology pattern 340 by pre-defined amounts $X_2$ and $Y_2$. The center 333 of metrology pattern 330 is further designed to be separated from, for example the center 343 of pattern 340 by pre-defined amounts $X_3$ and $Y_3$. Similarly, the centers of any two metrology patterns may be designed to be separated by pre-defined amounts $X_n$ and $Y_n$. By way of example only, each of the metrology patterns 340, 350, 360, and 370, similar to patterns 320 and 330, is a square metrology pattern in which each sub-pattern occupies one quadrant of that metrology pattern. Measurement of the position of the center of each metrology pattern 340, 350, 360, and 370 may be accomplished as described above for patterns 320 and 330.

FIG. 3C depicts an example embodiment of a system of metrology overlay without the X-Y coordinate layout depicted, to illustrate an example of how multiple metrology patterns (similar to those of FIG. 3B) may alternatively appear in actual practice, for example, as printed on an inactive space of a manufactured wafer. FIG. 3C also depicts some sub-patterns of three metrology patterns (340, 360 and 370) as including periodic structures with structural elements that themselves contain sub-structures 345, 365, 375 including a plurality of sub-elements. Such sub-structures may be used for circuit structure fields with finely-sized circuit regions, oriented with a particular direction with respect to other fields, that are much smaller than the size of other regions of the circuit structure field. The sub-elements of the sub-structures 345, 355, 375 allow for finer measurement of the overlay of these finely-size circuit regions. By way of example, metrology pattern 370 is depicted as having one pair of sub-patterns 371 that includes sub-structures 375 with a plurality of sub-elements, and another pair of sub-patterns 372 lacking such sub-structures. This may correspond, for example, to a circuit structure field with finely-sized regions oriented in one direction for which a finer measurement of overlay is required. Similarly by way of example, metrology pattern 340 is depicted as having one pair of sub-patterns 342 that includes sub-structures 345 with a plurality of sub-elements, and another pair of sub-patterns 341 lacking such sub-structures. By way of example, metrology pattern 360 illustrates a metrology pattern in which all sub-patterns make use of sub-structures 365. By way of further example, metrology patterns 320, 330, and 350 are depicted in conjunction with patterns 340, 360, and 370 to illustrate that metrology patterns with sub-structures may be combined with metrology patterns without sub-structures within a metrology overlay system, as may be required by the particular design rules of the integrated circuit being manufactured. As in FIG. 3A, related sub-patterns of each metrology pattern are depicted here with differing patterns for ease of visual reference to clearly show which sub-patterns belong to the same metrology pattern, and may not be part of the metrology pattern actually printed.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has,"

"includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A system comprising:
a first metrology pattern for a first circuit structure field, the first metrology pattern comprising at least two first pairs of sub-patterns, at least one sub-pattern of the at least two first pairs of sub-patterns lacking 90 degree rotational symmetry, and a first center position for the first metrology pattern being determinable in an X-Y coordinate layout, wherein one first pair of sub-patterns of the at least two first pairs of sub-patterns independently determines an X coordinate of the first center position and another first pair of sub-patterns of the at least two first pairs of sub-patterns independently determines a Y coordinate of the first center position; and
a second metrology pattern for a second circuit structure field, the second metrology pattern comprising at least two second pairs of sub-patterns, at least one sub-pattern of the at least two second pairs of sub-patterns lacking 90 degree rotational symmetry, and a second center position for the second metrology pattern being determinable in the X-Y coordinate layout, wherein one second pair of sub-patterns of the at least two second pairs of sub-patterns independently determines an X coordinate of the second center position and another second pair of sub-patterns of the at least two second pairs of sub-patterns independently determines a Y coordinate of the second center position.

2. The system of claim 1, wherein the X-Y coordinate layout facilitates an arrangement of the first metrology pattern in relation to the second metrology pattern, the arrangement facilitating independent comparison of the X coordinate of the first center position of the first metrology pattern with the X coordinate of the second center position of the second metrology pattern, and the arrangement facilitating independent comparison of the Y coordinate of the first center position of the first metrology pattern with the Y coordinate of the second center position of the second metrology pattern.

3. The system of claim 2, wherein the arrangement nests the first metrology pattern with the second metrology pattern so that the first center position and the second center position are designed to coincide at a same point in the X-Y coordinate layout, and wherein one or more positional deviations between the first center position and the second center position indicate an overlay error between the first circuit structure field and the second circuit structure field.

4. The system of claim 3, further comprising at least one additional metrology pattern for at least one additional circuit structure field, the at least one additional metrology pattern comprising at least two additional pairs of sub-patterns, at least one sub-pattern of the at least two additional pairs of sub-patterns lacking 90 degree rotational symmetry, and at least one additional center position for the at least one additional metrology pattern being determinable in the X-Y coordinate layout, wherein one additional pair of sub-patterns of the at least two additional pairs of sub-patterns independently determine an X coordinate of the additional center position and another additional pair of sub-patterns of the at least two additional pairs of sub-patterns independently determine a Y coordinate of the additional center position.

5. The system of claim 4, wherein the arrangement further nests the at least one additional metrology pattern with the first metrology pattern and the second metrology pattern, wherein the at least one additional center position and first center position and second center position are designed to coincide at the same point in the X-Y coordinate layout, and wherein one or more positional deviations between the at least one additional center position and the first center position indicate an overlay error between the additional circuit structure field and the first circuit structure field, and wherein one or more positional deviations between the at least one additional center position and the second center position indicate an overlay error between the additional circuit structure field and the second circuit structure field.

6. The system of claim 3, wherein at least one of the first and second metrology patterns is a square metrology pattern comprising two pairs of sub-patterns, wherein sub-patterns of the two pairs of sub-patterns have centers that coincide with of the square metrology pattern.

7. The system of claim 3, wherein at least one sub-pattern of at least one of the first or second pairs of sub-patterns of at least one of the first and second metrology patterns comprises at least one periodic structure, the at least one periodic structure comprising a plurality of structural elements.

8. The system of claim 7, wherein the plurality of structural elements are a plurality of parallel bars and a plurality of spaces, the plurality of spaces being interleaved with and separating the plurality of parallel bars.

9. The system of claim 7, wherein the at least one periodic structure further comprises at least one structural element comprising a periodic sub-structure, the periodic sub-structure comprising a plurality of structural sub-elements.

10. The system of claim 2, wherein the arrangement offsets the first metrology pattern from the second metrology pattern, so that the first center position and second center position are designed to be offset horizontally by a pre-defined amount $X_1$ in the X-Y coordinate layout and offset vertically by a pre-defined amount $Y_1$ in the X-Y coordinate layout when an overlay error between the first circuit structure field and the second circuit structure field is zero, and wherein one or more positional deviations from the pre-defined amount $X_1$ or the pre-defined amount $Y_1$ indicate an overlay error between the first circuit structure field and the second circuit structure field.

11. The system of claim 10, wherein the first metrology pattern and the second metrology pattern are not designed to be nested within the arrangement.

12. The system of claim 10, further comprising at least one additional metrology pattern for at least one additional circuit structure field, the at least one additional metrology pattern comprising at least two additional pairs of sub-patterns, at least one sub-pattern of the at least two additional pairs of sub-patterns lacking 90 degree rotational symmetry, and at least one additional center position for the at least one additional metrology pattern being determinable in the X-Y coordinate layout, wherein one additional pair of sub-patterns of the at least two additional pairs of sub-patterns independently determine an X coordinate of the additional center position and another additional pair of sub-patterns of the at least two additional pairs of sub-patterns independently determine a Y coordinate of the additional center position.

13. The system of claim 12, wherein the arrangement offsets the at least one additional metrology pattern from the first metrology pattern and the second metrology pattern, so that the first center position and the at least one additional center position are designed to be offset horizontally by a pre-defined amount $X_2$ in the X-Y coordinate layout and offset vertically by a pre-defined amount $Y_2$ in the X-Y coordinate layout, and wherein one or more positional deviations from the pre-defined amount $X_2$ or the pre-defined amount $Y_2$ indicate an overlay error between the first circuit structure field and the at least one additional circuit structure field, and the second center position and the at least one additional center position are designed to be offset horizontally by a pre-defined amount $X_3$ and offset vertically by a pre-defined amount $Y_3$ in the X-Y coordinate layout, and wherein one or more positional deviations from the pre-defined amount $X_3$ or the pre-defined amount $Y_3$ indicate an overlay error between the second circuit structure field and the at least one additional circuit structure field.

14. The system of claim 10, wherein at least one of the first and second metrology patterns is a square metrology pattern comprising two pairs of sub-patterns, wherein sub-patterns of the two pairs of sub-patterns occupy diagonally opposed quadrants of the square metrology pattern.

15. The system of claim 10, wherein at least one sub-pattern of at least one of the first or second pairs of sub-patterns of at least one of the first and second metrology patterns comprises at least one periodic structure, the at least one periodic structure comprising a plurality of structural elements.

16. The system of claim 15, wherein the plurality of structural elements are a plurality of parallel bars and a plurality of spaces, the plurality of spaces being interleaved with and separating the plurality of parallel bars.

17. The system of claim 15, wherein the at least one periodic structure comprises at least one structural element comprising a periodic sub-structure, the periodic sub-structure comprising a plurality of structural sub-elements.

18. A method for facilitating determining overlay accuracy, comprising:
providing a first metrology pattern for a first circuit structure field, the first metrology pattern comprising at least two first pairs of sub-patterns, at least one sub-pattern of the at least two first pairs of sub-patterns lacking 90 degree rotational symmetry, and a first center position for the first metrology pattern being determinable in an X-Y coordinate layout, wherein one first pair of sub-patterns of the at least two first pairs of sub-patterns independently determine an X coordinate of the first center position and another first pair of sub-patterns of the at least two first pairs of sub-patterns independently determine a Y coordinate of the first center position;
providing a second metrology pattern for a second circuit structure field, the second metrology pattern comprising at least two second pairs of sub-patterns, at least one sub-pattern of the at least two second pairs of sub-patterns lacking 90 degree rotational symmetry, and a second center position for the second metrology pattern being determinable in the X-Y coordinate layout wherein one second pair of sub-patterns of the at least two second pairs of sub-patterns independently determine an X coordinate of the second center position and another second pair of sub-patterns of the at least two second pairs of sub-patterns independently determine a Y coordinate of the second center position; and
arranging the first metrology pattern and the second metrology pattern in relation to each other within the X-Y coordinate layout.

19. The method of claim 18, wherein the arranging further comprises nesting the first metrology pattern with the second metrology pattern so that the first center position and the second center position are designed to coincide at a same point in the X-Y coordinate layout.

20. The method of claim 18, wherein the arranging further comprises offsetting the first metrology pattern from the second metrology pattern, so that the first center position and second center position are designed to be offset horizontally by a pre-defined amount $X_1$ in the X-Y coordinate layout and offset vertically by a pre-defined amount $Y_1$ in the X-Y coordinate layout, and wherein the first metrology pattern and the second metrology pattern are not designed to be nested.

* * * * *

UNITED STATES PATENT AND TRADEMARK OFFICE
CERTIFICATE OF CORRECTION

PATENT NO. : 9,329,495 B2  
APPLICATION NO. : 14/084676  
DATED : May 3, 2016  
INVENTOR(S) : Dai et al.

Page 1 of 1

It is certified that error appears in the above-identified patent and that said Letters Patent is hereby corrected as shown below:

In the claims  
Column 14, Line 34 & 35: Claim 6, Delete "with of" and insert -- with corners of --

Signed and Sealed this  
Twelfth Day of July, 2016

Michelle K. Lee  
*Director of the United States Patent and Trademark Office*